United States Patent
Chen et al.

(10) Patent No.: US 12,225,312 B2
(45) Date of Patent: Feb. 11, 2025

(54) BINNING SYSTEM

(71) Applicant: Himax Imaging Limited, Tainan (TW)

(72) Inventors: Po-Chang Chen, Tainan (TW); Dong-Long Lin, Tainan (TW)

(73) Assignee: Himax Imaging Limited, Tainan (TW)

( * ) Notice: Subject to any disclaimer, the term of this patent is extended or adjusted under 35 U.S.C. 154(b) by 130 days.

(21) Appl. No.: 18/117,439

(22) Filed: Mar. 4, 2023

(65) Prior Publication Data
US 2024/0323564 A1    Sep. 26, 2024

(51) Int. Cl.
| | |
|---|---|
| *H04N 25/767* | (2023.01) |
| *G06V 10/147* | (2022.01) |
| *H01L 21/768* | (2006.01) |
| *H01L 27/146* | (2006.01) |
| *H01L 27/148* | (2006.01) |
| *H04N 25/131* | (2023.01) |
| *H04N 25/771* | (2023.01) |

(52) U.S. Cl.
CPC ..... *H04N 25/767* (2023.01); *H01L 21/76816* (2013.01); *H01L 27/14609* (2013.01); *H01L 27/14881* (2013.01); *H04N 25/131* (2023.01); *H04N 25/771* (2023.01); *G06V 10/147* (2022.01)

(58) Field of Classification Search
CPC .. H04N 25/767; H04N 25/131; H04N 25/771; H04N 25/135; H04N 25/46; H01L 21/76816; H01L 27/14609; H01L 27/14881; G06V 10/147
See application file for complete search history.

(56) References Cited

U.S. PATENT DOCUMENTS

2022/0174234 A1*  6/2022  Roffet .............. H04N 25/583
2023/0036544 A1*  2/2023  Tsai ................. H04N 23/84

* cited by examiner

*Primary Examiner* — Seung C Sohn
(74) *Attorney, Agent, or Firm* — Donald E. Stout; Stout, Uxa & Buyan, LLP

(57) ABSTRACT

A binning system includes a red-green-blue-infrared (RGB-IR) image sensor including at least one pixel group composed of 2×2 sub-groups, each having 2×2 pixels including two green pixels, one infrared pixels and one red or blue pixel, the 2×2 sub-groups being arranged such that the pixel group is half green, one quarter infrared, one eighth red and one eighth blue; and a digital binning device that performs pixel binning on at least one addend pixel to result in a binned pixel. The binned pixel and the at least one addend pixel are located in a same pixel group.

14 Claims, 5 Drawing Sheets pixel group

| | | | | | | | |
|---|---|---|---|---|---|---|---|
| P11 B | P12 Gbr | P13 R | P14 Gbr | P15 B | P16 Gbr | P17 R | P18 Gbr |
| P21 Gir | P22 IR | P23 Gir | P24 IR | P25 Gir | P26 IR | P27 Gir | P28 IR |
| P31 R | P32 Gbr | P33 B | P34 Gbr | P35 R | P36 Gbr | P37 B | P38 Gbr |
| P41 Gir | P42 IR | P43 Gir | P44 IR | P45 Gir | P46 IR | P47 Gir | P48 IR |
| P51 B | P52 Gbr | P53 R | P54 Gbr | P55 B | P56 Gbr | P57 R | P58 Gbr |
| P61 Gir | P62 IR | P63 Gir | P64 IR | P65 Gir | P66 IR | P67 Gir | P68 IR |
| P71 R | P72 Gbr | P73 B | P74 Gbr | P75 R | P76 Gbr | P77 B | P78 Gbr |
| P81 Gir | P82 IR | P83 Gir | P84 IR | P85 Gir | P86 IR | P87 Gir | P88 IR | pixel group

| P11 B | P12 Gbr | P13 R | P14 Gbr | P15 B | P16 Gbr | P17 R | P18 Gbr |
|---|---|---|---|---|---|---|---|
| P21 Gir | P22 IR | P23 Gir | P24 IR | P25 Gir | P26 IR | P27 Gir | P28 IR |
| P31 R | P32 Gbr | P33 B | P34 Gbr | P35 R | P36 Gbr | P37 B | P38 Gbr |
| P41 Gir | P42 IR | P43 Gir | P44 IR | P45 Gir | P46 IR | P47 Gir | P48 IR |
| P51 B | P52 Gbr | P53 R | P54 Gbr | P55 B | P56 Gbr | P57 R | P58 Gbr |
| P61 Gir | P62 IR | P63 Gir | P64 IR | P65 Gir | P66 IR | P67 Gir | P68 IR |
| P71 R | P72 Gbr | P73 B | P74 Gbr | P75 R | P76 Gbr | P77 B | P78 Gbr |
| P81 Gir | P82 IR | P83 Gir | P84 IR | P85 Gir | P86 IR | P87 Gir | P88 IR |

| P11' B | P12' Gbr | | | P15' R | P16' Gbr | | |
|---|---|---|---|---|---|---|---|
| P21' Gir | P22' IR | | | P25' Gir | P26' IR | | |
| | | | | | | | |
| | | | | | | | |
| P51' R | P52' Gbr | | | P55' B | P56' Gbr | | |
| P61' Gir | P62' IR | | | P65' Gir | P66' IR | | |
| | | | | | | | |
| | | | | | | | |

*FIG. 2B*

| | P11 B | P12 Gbr | P13 R | P14 Gbr | P15 B | P16 Gbr | P17 R | P18 Gbr |
|---|---|---|---|---|---|---|---|---|
| 4 | P21 Gir | P22 IR | P23 Gir | P24 IR | P25 Gir | P26 IR | P27 Gir | P28 IR |
| 3 | P31 R | P32 Gbr | P33 B | P34 Gbr | P35 R | P36 Gbr | P37 B | P38 Gbr |
|  | P41 Gir | P42 IR | P43 Gir | P44 IR | P45 Gir | P46 IR | P47 Gir | P48 IR |
| 2 | P51 B | P52 Gbr | P53 R | P54 Gbr | P55 B | P56 Gbr | P57 R | P58 Gbr |
|  | P61 Gir | P62 IR | P63 Gir | P64 IR | P65 Gir | P66 IR | P67 Gir | P68 IR |
| 1 | P71 R | P72 Gbr | P73 B | P74 Gbr | P75 R | P76 Gbr | P77 B | P78 Gbr |
|  | P81 Gir | P82 IR | P83 Gir | P84 IR | P85 Gir | P86 IR | P87 Gir | P88 IR | row group

*FIG. 2C*

BINNING SYSTEM

BACKGROUND OF THE INVENTION

1. Field of the Invention

The present invention generally relates to pixel binning, and more particularly to a binning system and method adaptable to an RGB-IR image sensor.

2. Description of Related Art

An image sensor is a device that converts light waves into electric signals. A Bayer filter, which is a color filter array (CFA) with specific arrangement of color filters, is commonly placed over the pixel sensors of the image sensors to capture color information.

As sensor resolution of the image sensors is increasing due to advanced technology, applications utilizing the high-resolution image sensors encounter high data rate, high power consumption and low sensitivity of the small pixel sensors. In order to balance the application among resolution, sensitivity and power consumption, pixel binning may be adopted to combine adjacent pixels throughout an image, by summing or averaging their values. Therefore, data rate can be substantially reduced, at the cost of resolution, without sacrificing the sensitivity of the image sensors.

Conventional Bayer pixel binning methods, however, suffer aliasing (e.g., jagged line), which is one key performance indicator to scaling down methods for pixel binning. Moreover, conventional digital pixel binning methods require line buffers with substantive length requirements.

A need has thus arisen to propose a novel scheme to overcome drawbacks of the conventional pixel binning methods.

SUMMARY OF THE INVENTION

In view of the foregoing, it is an object of the embodiment of the present invention to provide a binning system and method adaptable to an RGB-IR image sensor with reduced aliasing phenomenon and reduced length of line buffers.

According to one embodiment, a binning system includes a red-green-blue-infrared (RGB-IR) image sensor and a digital binning device. The RGB-IR image sensor includes at least one pixel group composed of 2×2 sub-groups, each having 2×2 pixels including two green pixels, one infrared pixels and one red or blue pixel. The 2×2 sub-groups are arranged such that the pixel group is half green, one quarter infrared, one eighth red and one eighth blue. The digital binning device performs pixel binning on at least one addend pixel to result in a binned pixel. The binned pixel and the at least one addend pixel are located in a same pixel group.

BRIEF DESCRIPTION OF THE DRAWINGS

FIG. 2B shows a schematic diagram illustrating a binned group after performing pixel binning on the 2×2 pixel groups;

FIG. 2C shows a schematic diagram illustrating pixel binning process performed on the 2×2 pixel groups of FIG. 2A by averaging (or weighted summing) one or more addend pixels with same color to result in a binned pixel;

DETAILED DESCRIPTION OF THE INVENTION

Figures 1, 2A:
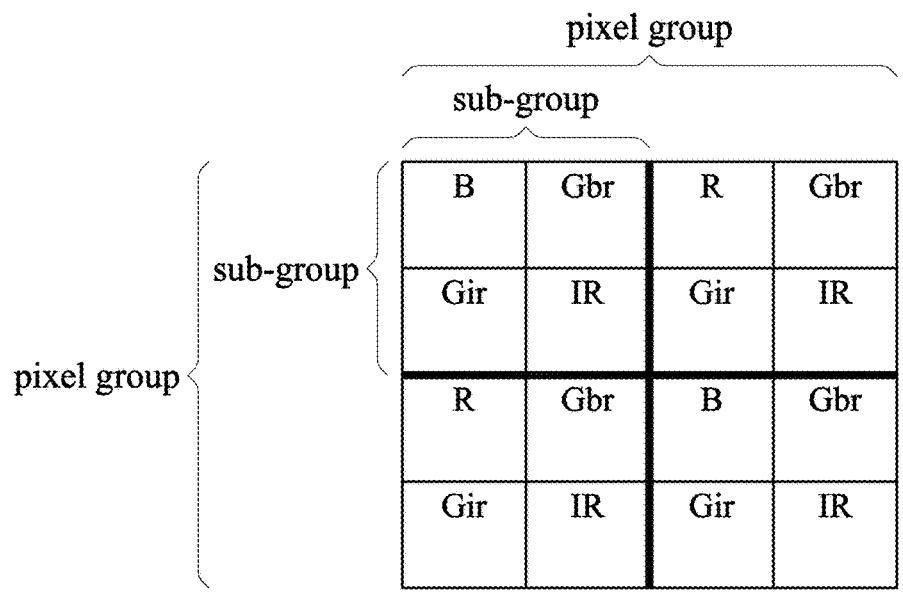
FIG. 1 shows a schematic diagram illustrating one pixel group of a red-green-blue-infrared (RGB-IR) image sensor covered with a filter array composed of 4×4 pixels according to one embodiment of the present invention.
FIG. 2A shows a schematic diagram illustrating 2×2 pixel groups of the RGB-IR image sensor of FIG. 1.

FIG. 1 shows a schematic diagram illustrating one pixel group of a red-green-blue-infrared (RGB-IR) image sensor covered with a filter array composed of 4×4 pixels according to one embodiment of the present invention. Specifically, the pixel group may include 2×2 sub-groups, each of which is composed of 2×2 pixels including two green pixels, one infrared pixel and one red or blue pixel arranged as shown in FIG. 1, which, alternatively speaking, is half green, one quarter infrared, and one quarter red or blue. As shown in FIG. 1, the green pixel in a row with the blue pixel and the red pixel is denoted by Gbr, and the green pixel in a row with the infrared pixel is denoted by Gir.

FIG. 2A shows a schematic diagram illustrating 2×2 pixel groups of the RGB-IR image sensor of FIG. 1, and FIG. 2B shows a schematic diagram illustrating a binned group after performing pixel binning on the 2×2 pixel groups by averaging (or weighted summing) adjacent pixels (data). Accordingly, the 2×2 pixel groups becomes a single binned group, thereby reducing the number of pixels (and resolution and noise) to ¼ but enhancing sensitivity four times for green and infrared and one or two times for red and blue.

FIG. 2C shows a schematic diagram illustrating pixel binning process performed on the 2×2 pixel groups by averaging (or weighted summing) (denoted by arrows) one or more addend pixels (data) with same color (or wavelength) to result in a binned pixel (data) (pointed by arrowhead). According to one aspect of one embodiment, the binned pixel and the addend pixel(s) are located in a same pixel group.

According to another aspect of the embodiment, there exists at most one pixel disposed between the binned pixel and the addend pixel either vertically, horizontally or diagonally. In other words, only the addend pixel or pixels nearest the binned pixel are used in the pixel binning. The pixel binning of the embodiment may be expressed as follows (averaging or weighting operations are omitted for brevity):

$$(G) \; P12' = P12 + P14 + P32 + P34$$

$$(G) \; P21' = P21 + P23 + P41 + P43$$

$$(IR) \; P22' = P22 + P24 + P42 + P44$$

-continued (B) $P11' = P11 + P33$ (alternatively $P11' = P11$)

(G) $P16' = P16 + P18 + P36 + P38$ (G) $P25' = P25 + P27 + P45 + P47$ (IR) $P26' = P26 + P28 + P46 + P48$ (R) $R15' = P17 + P35$ (alternatively $P15' = P17$, or alternatively $P15' = P13 + P17$)

(R) $P51' = P53 + P71$ (alternatively $P51' = P53$)

(G) $P52' = P52 + P54 + P72 + P74$ (G) $P61' = P61 + P63 + P81 + P83$ (IR) $P62' = P62 + P64 + P82 + P84$ (B) $P55' = P55 + P77$ (alternatively $P55' = P55$)

(G) $P56' = P56 + P58 + P76 + P78$ (G) $P65' = P65 + P67 + P85 + P87$ (IR) $P66' = P66 + P68 + P86 + P88$

It is particularly noted that, if color of a binned pixel (e.g., P15') as denoted by a hollow circle is different from color of an original pixel (e.g., P15) where the binned pixel occupies, pixel data of that original pixel is excluded from averaging (or weighted summing). Otherwise, if color of a binned pixel (e.g., P11') as denoted by a solid circle is the same as color of an original pixel (e.g., P11) where the binned pixel occupies, pixel data of that original pixel is included in averaging (or weighted summing).

Figure 3:
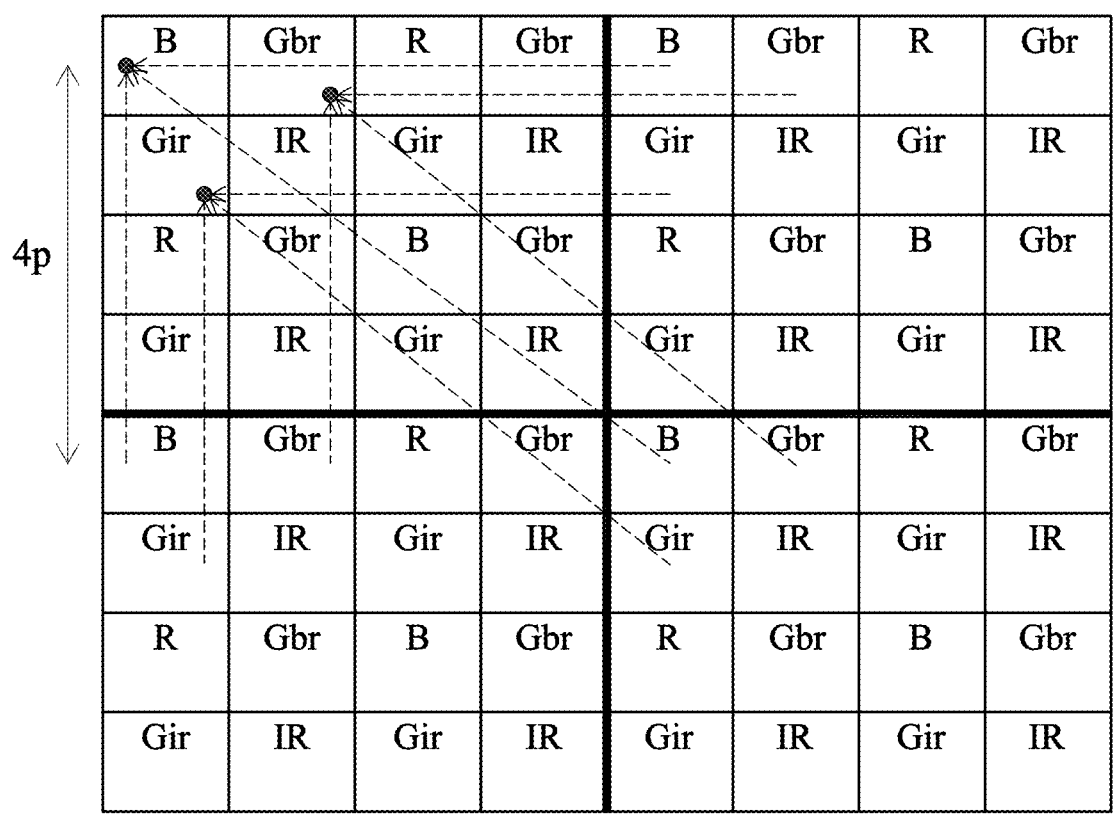
FIG. 3 shows a schematic diagram illustrating pixel binning process performed on 2×2 pixel groups without adopting the pixel binning scheme as shown in FIG. 2C.

FIG. 3 shows a schematic diagram illustrating pixel binning process performed on 2×2 pixel groups without adopting the pixel binning scheme as shown in FIG. 2C. For brevity, only a portion of the pixel binning is shown. Specifically, pixels at corresponding positions of four adjacent pixel groups are averaged (or summed) as shown. It is noted that the pitch between the binned pixel and the addend pixel is four (i.e., three pixels disposed between the binned pixel and the addend pixel) in FIG. 3, while the pitch between the binned pixel and the addend pixel is two (i.e., only one pixel disposed between the binned pixel and the addend pixel) in FIG. 2C. As the length of line buffer used for pixel binning is decided by the corresponding pitch, the length of line buffer for pixel binning in the embodiment of FIG. 2C may be substantially reduced compared to the pixel binning of FIG. 3. More importantly, aliasing phenomenon associated with the pixel binning in the embodiment of FIG. 2C can be substantially reduced compared to the pixel binning of FIG. 3.

Figure 4A:
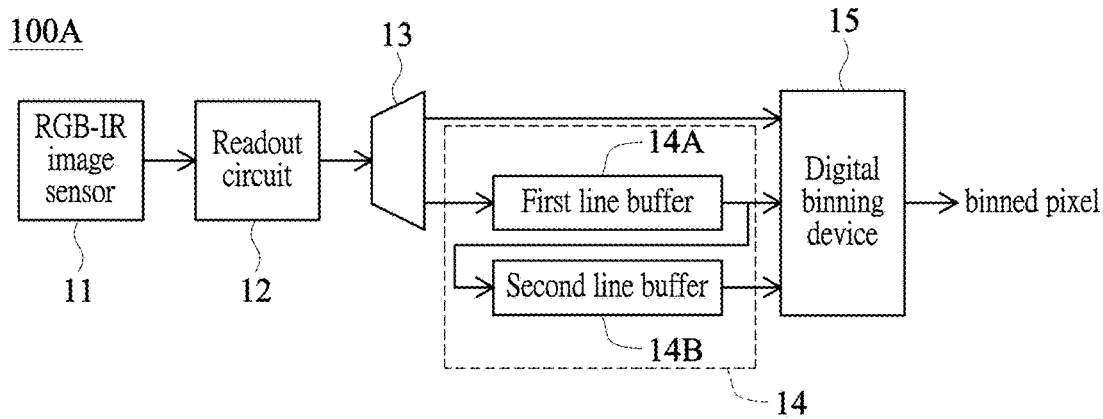
FIG. 4A shows a block diagram illustrating a binning system adaptable to the RGB-IR image sensor of FIG. 1 according to one embodiment of the present invention.
Figure 4B:
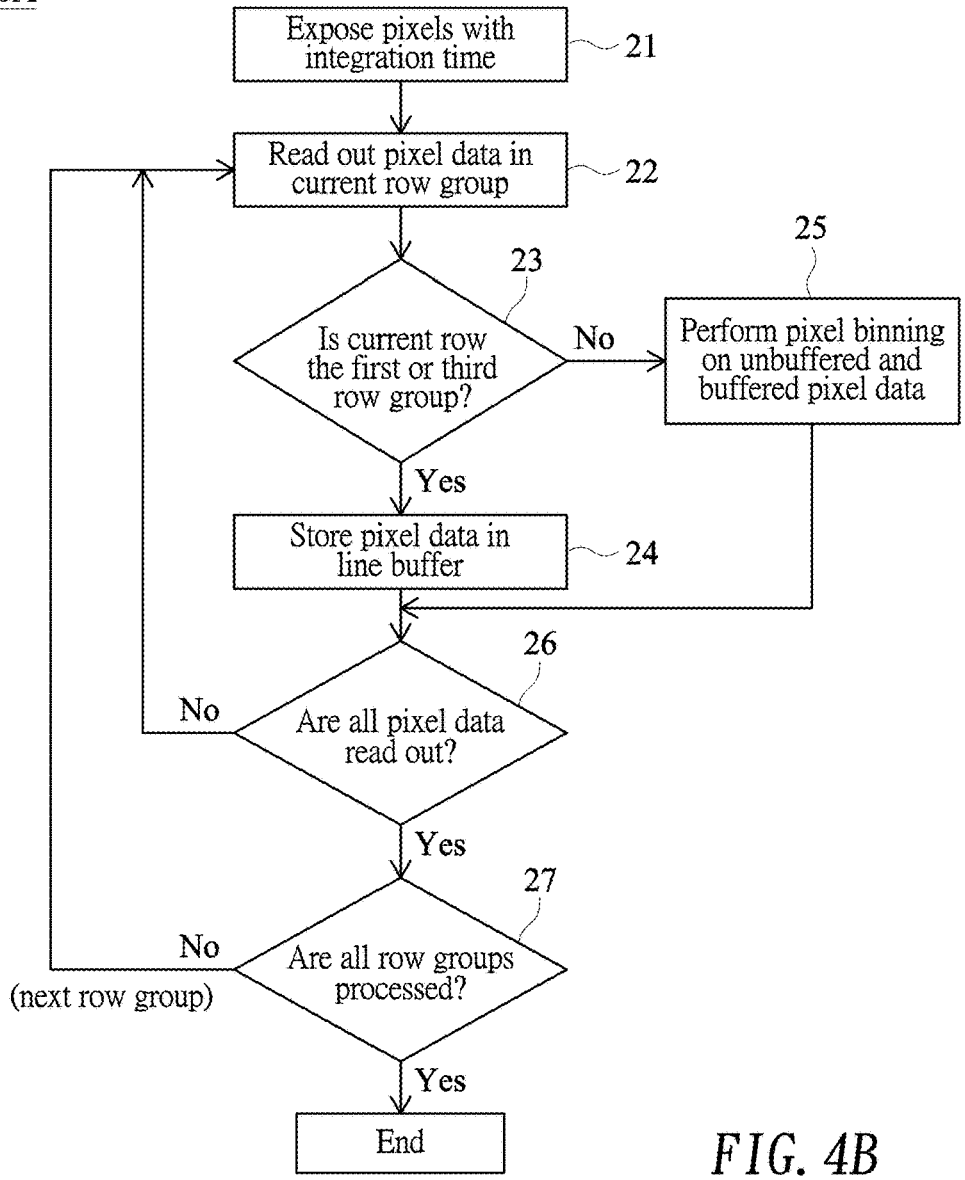
FIG. 4B shows a flow diagram illustrating a binning method adaptable to the RGB-IR image sensor of FIG. 1 according to one embodiment of the present invention.

FIG. 4A shows a block diagram illustrating a binning system 100A adaptable to the RGB-IR image sensor of FIG. 1 according to one embodiment of the present invention, and FIG. 4B shows a flow diagram illustrating a binning method 200A adaptable to the RGB-IR image sensor of FIG. 1 according to one embodiment of the present invention.

In the embodiment, the binning system 100A may include an RGB-IR image sensor 11 composed of a plurality of pixels, which are exposed and resultant charges are accumulated with an integration time (step 21).

The binning system 100A may include a readout circuit 12 coupled to receive accumulated charges from the RGB-IR image sensor 11 and configured to generate pixel data row group by row group, for example, from bottom up and from left to right (step 22), where each row group is defined as including two adjacent rows.

The binning system 100A of the embodiment may include a demultiplexer 13 coupled to receive the pixel data (from the readout circuit 12). The binning system 100A may include a memory unit 14 or a row group buffer (in one specific embodiment, composed of a first line buffer 14A and a second line buffer 14B, which may, for example, be combined into a single line buffer) coupled to receive the pixel data (of one row group or two rows) from a first output node of the demultiplexer 13. The binning system 100A may include a digital binning device 15 coupled to receive either buffered pixel data (from the first/second line buffer 14A/14B) or (unbuffered) pixel data from a second output node of the demultiplexer 13, and configured to perform pixel binning on the pixel data by averaging (or weighted summing) one or more addend pixels (data) to result in a binned pixel (data).

In step 23, if the current row is the first or third row group, such as the row groups 1 and 3 (as exemplified in FIG. 2C), the pixel data is read out row by row from the RGB-IR image sensor 11 and then stored in the first/second line buffer 14A/14B via the demultiplexer 13 (step 24).

If the current row is not the first or third row group, such as the row groups 2 and 4 (as exemplified in FIG. 2C) (the No branch of step 23), the (unbuffered) pixel data is received from the second output node of the demultiplexer 13, which is used along with the buffered pixel data (from the first/second line buffer 14A/14B) to perform pixel binning (step 25). Steps 22-25 are repeated until all pixel data are read out (step 26) and all row groups have been processed (step 27).

Figure 5A:
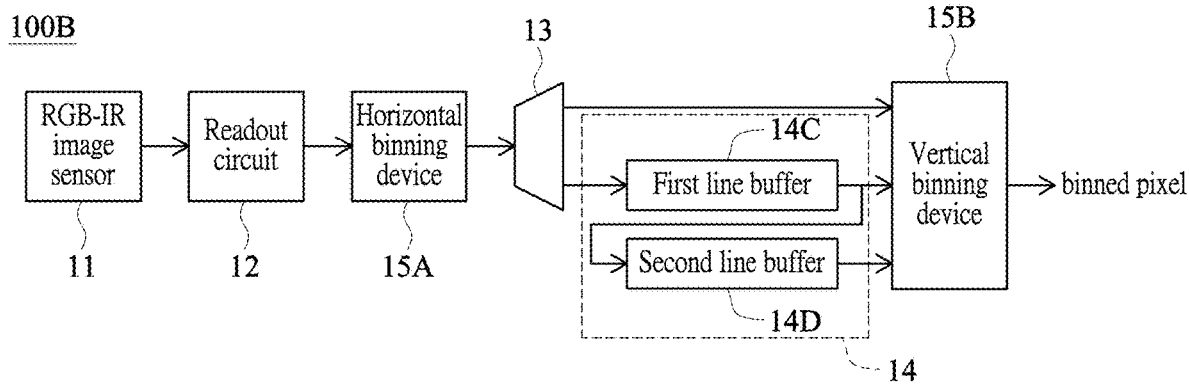
FIG. 5A shows a block diagram illustrating a binning system adaptable to the RGB-IR image sensor of FIG. 1 according to another embodiment of the present invention.
Figure 5B:
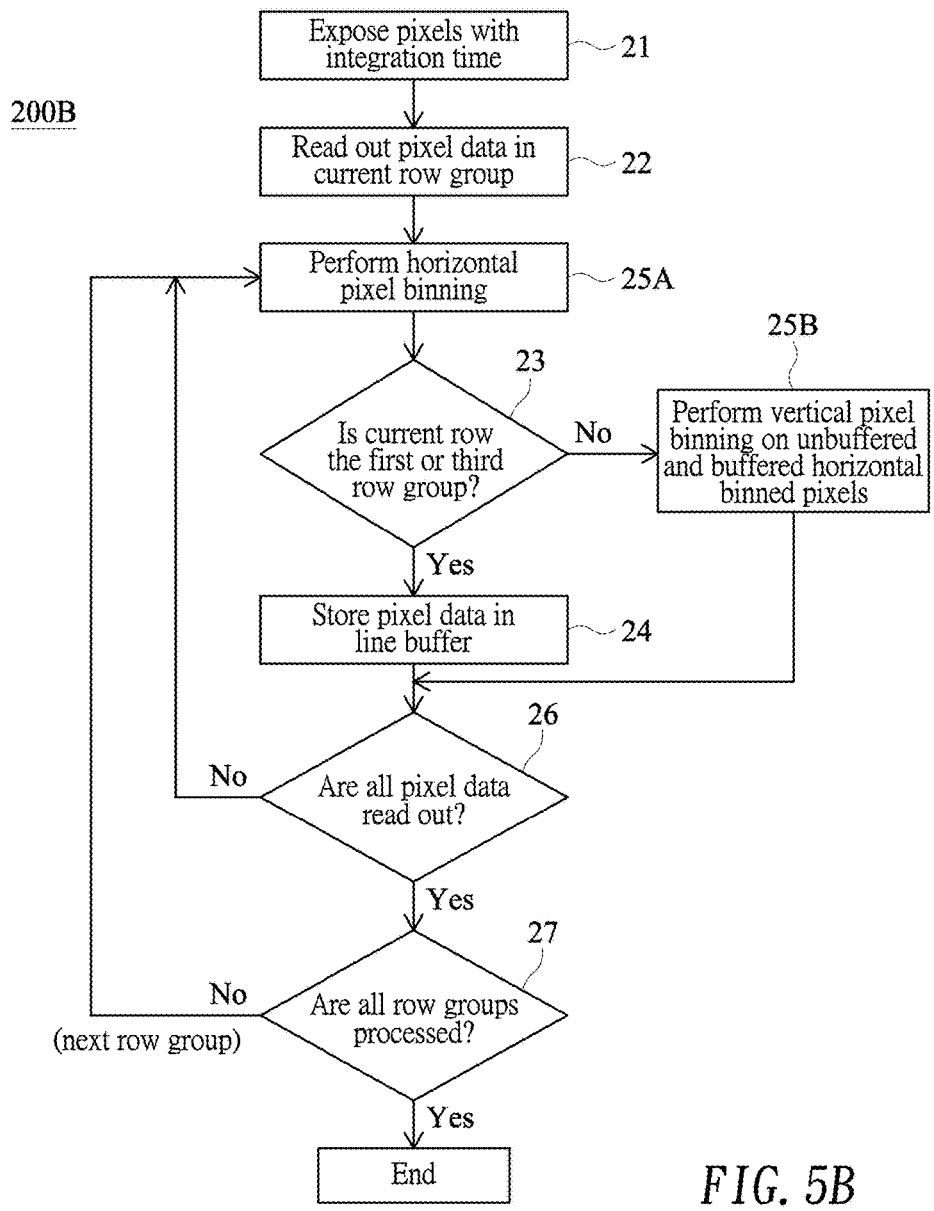
FIG. 5B shows a flow diagram illustrating a binning method adaptable to the RGB-IR image sensor of FIG. 1 according to another embodiment of the present invention.

FIG. 5A shows a block diagram illustrating a binning system 100B adaptable to the RGB-IR image sensor of FIG. 1 according to another embodiment of the present invention, and FIG. 5B shows a flow diagram illustrating a binning method 200B adaptable to the RGB-IR image sensor of FIG. 1 according to another embodiment of the present invention. The binning system and method 100B/200B of FIG. 5A/5B is similar to the binning system and method 100A/200A of FIG. 4A/4B with the following exceptions.

In the embodiment, the binning system 100B may include a horizontal binning device 15A coupled to receive the pixel data in the current row group from the readout circuit 12 (where each row group is defined as including two adjacent rows), and configured to perform horizontal pixel binning in a same horizontal line, thereby resulting in horizontal binned pixel (data) (step 25A). Specifically, an addend pixel (if any exists) to the right of a horizontal binned pixel within a same pixel group is added thereto and averaged (or weighted summed), and therefore there exists at most one pixel disposed between the horizontal binned pixel and the addend pixel. The horizontal pixel binning of the embodiment may be expressed as follows (averaging or weighting operations are omitted for brevity):

(G) $P41\_h = P41 + P43$    (G) $P45\_h = P45 + P47$ (IR) $P42\_h = P42 + P44$    (IR) $P46\_h = P46 + P48$ (R) $P31\_h = P31$    (R) $P35\_h = P35$ (G) $P32\_h = P32 + P34$    (G) $P36\_h = P36 + P38$ (B) $P33\_h = P33$    (B) $P37\_h = P37$ (G) $P21\_h = P21 + P23$    (G) $P25\_h = P25 + P27$

-continued (IR) $P22\_h = P22 + P24$   (IR) $P26\_h = P26 + P28$ (R) $P13\_h = P13$   (R) $P17\_h = P17$ (G) $P12\_h = P12 + P14$   (G) $P16\_h = P16 + P18$ (B) $P11\_h = P11$   (B) $P15\_h = P15$ In the embodiment, the binning system 100B may include a vertical horizontal binning device 15B configured to perform vertical pixel binning on the horizontal binned pixels along same columns within a pixel group, thereby resulting in the binned pixels.

In step 23, if the current row is the first or third row group, such as the row groups 1 and 3 (as exemplified in FIG. 2C), the horizontal binned pixel is then stored in the first/second line buffer 14C/14D via the demultiplexer 13 (step 24).

If the current row is not the first or third row group, such as the row groups 2 and 4 (as exemplified in FIG. 2C) (the No branch of step 23), the (unbuffered) horizontal binned pixel is received (by the vertical binning device 15B) from the second output node of the demultiplexer 13, which is used along with the buffered horizontal binned pixel (from the first/second line buffer 14C/14D) to perform vertical pixel binning (step 25B). Steps 22-25B are repeated until all pixel data are read out (step 26) and all row groups have been processed (step 27). It is noted that, as the horizontal pixel binning is performed first, the length of the first/second line buffer 14C/14D may be reduced to half compared to the first/second line buffer 14A/14B in FIG. 4A. The vertical pixel binning of the embodiment may be expressed as follows (averaging or weighting operations are omitted for brevity):

(G) $P21' = P21\_h + P41\_h$   (G) $P25' = P25\_h + P45\_h$ (IR) $P22' = P22\_h + P42\_h$   (IR) $P26' = P26\_h + P46\_h$ (G) $P12' = P12\_h + P32\_h$   (G) $P16' = P16\_h + P36\_h$ (B) $P11' = P11\_h + P33\_h$ (R) $P15' = P17\_h + P35\_h$

It is particularly noted that, if color of a binned pixel (e.g., P15') is different from color of an original pixel (e.g., P15) where the binned pixel occupies, another horizontal binned pixel (e.g., P17_h) of same color in the same pixel group is used instead for vertical pixel binning; and if color of an addend horizontal binned pixel (e.g., P31_h) is different from color of a binned pixel (P11'), another horizontal binned pixel (e.g., P33_h) of the same pixel group is used instead for vertical pixel binning. Otherwise, horizontal binned pixels of the same color in the same column of the same pixel group are averaged (or weighted summed) to result in the binned pixel.

Although specific embodiments have been illustrated and described, it will be appreciated by those skilled in the art that various modifications may be made without departing from the scope of the present invention, which is intended to be limited solely by the appended claims.

What is claimed is:

1. A binning system, comprising:
    a red-green-blue-infrared (RGB-IR) image sensor including at least one pixel group composed of 2×2 sub-groups, each having 2×2 pixels including two green pixels, one infrared pixels and one red or blue pixel, the 2×2 sub-groups being arranged such that the pixel group is half green, one quarter infrared, one eighth red and one eighth blue; and
    a digital binning device that performs pixel binning on at least one addend pixel to result in a binned pixel;
    wherein the binned pixel and the at least one addend pixel are located in a same pixel group.

2. The system of claim 1, wherein the pixel binning is performed by averaging or weighted summing the at least one addend pixel.

3. The system of claim 1, wherein at most one pixel is disposed between the binned pixel and the at least one addend pixel.

4. The system of claim 1, wherein if color of the binned pixel is different from color of an original pixel where the binned pixel occupies, said original pixel is excluded from the pixel binning.

5. The system of claim 1, further comprising:
    a readout circuit coupled to receive accumulated charges from the RGB-IR image sensor and configured to generate pixel data for the digital binning device.

6. The system of claim 5, further comprising:
    a memory unit coupled to receive the pixel data from the readout circuit, when a current row of the received pixel data is the first or third row group, thereby resulting in buffer pixel data.

7. The system of claim 6, wherein the memory unit comprises a first line buffer and a second line buffer.

8. The system of claim 6, wherein the digital binning device performs the pixel binning on the buffer pixel data and the received pixel data that is not buffered, when a current row of the received pixel data is not the first or third row group.

9. The system of claim 8, further comprising:
    a demultiplexer that controllably either provides the pixel data to the memory unit or provides the pixel data that is not buffered to the digital binning device.

10. The system of claim 1, wherein the digital binning device comprises:
    a horizontal binning device that performs horizontal pixel binning in a same horizontal line, thereby resulting in horizontal binned pixels.

11. The system of claim 10, wherein an addend pixel, if any exists, to the right of a horizontal binned pixel within a same pixel group is added thereto and then averaged or weighted summed.

12. The system of claim 10, wherein the digital binning device comprises:
    a vertical horizontal binning device that performs vertical pixel binning on the horizontal binned pixels along same columns within a pixel group, thereby resulting in the binned pixels.

13. The system of claim 12, wherein if color of the binned pixel is different from color of an original pixel where the binned pixel occupies, another horizontal binned pixel of same color in the same pixel group is used instead for the vertical pixel binning; otherwise, horizontal binned pixels of same color in a same column of the same pixel group are averaged or weighted summed to result in the binned pixel.

14. The system of claim 12, wherein if color of an addend horizontal binned pixel is different from color of the binned pixel, another horizontal binned pixel of the same pixel group is used instead for the vertical pixel binning; otherwise, horizontal binned pixels of same color in a same column of the same pixel group are averaged or weighted summed to result in the binned pixel.

* * * * *